United States Patent [19]

Durand et al.

[11] Patent Number: 5,531,020
[45] Date of Patent: Jul. 2, 1996

[54] METHOD OF MAKING SUBSURFACE ELECTRONIC CIRCUITS

[75] Inventors: David Durand, Providence; Roger A. Iannetta, Jr., Warwick, both of R.I.

[73] Assignee: Poly Flex Circuits, Inc., Cranston, R.I.

[21] Appl. No.: 112,225

[22] Filed: Aug. 27, 1993

Related U.S. Application Data

[63] Continuation-in-part of Ser. No. 974,370, Nov. 10, 1992, which is a continuation-in-part of Ser. No. 934,826, Aug. 24, 1992, abandoned, which is a continuation of Ser. No. 607,554, Nov. 1, 1990, abandoned, which is a continuation-in-part of Ser. No. 533,628, Jun. 5, 1990, abandoned, which is a continuation-in-part of Ser. No. 436,199, Nov. 14, 1989, Pat. No. 5,180,523.

[51] Int. Cl.$^6$ ....................................................... H05K 3/34
[52] U.S. Cl. ............................. 29/840; 29/846; 174/260; 264/61
[58] Field of Search ........................... 29/840, 846, 848; 427/96; 174/260; 264/61

[56] References Cited

U.S. PATENT DOCUMENTS

| | | |
|---|---|---|
| 3,152,938 | 10/1964 | Osifchin et al. . |
| 4,402,135 | 9/1983 | Schweingruber et al. ............. 29/848 X |
| 4,528,259 | 7/1985 | Sullivan . |
| 4,581,098 | 4/1986 | Gregor ................................. 427/96 X |
| 4,645,733 | 2/1987 | Sullivan . |
| 4,694,572 | 9/1987 | Leber et al. ............................. 29/840 |
| 4,756,929 | 7/1988 | Sullivan . |
| 4,775,611 | 10/1988 | Sullivan . |
| 4,882,839 | 11/1989 | Okada . |
| 4,912,020 | 3/1990 | King et al. . |
| 4,982,892 | 1/1991 | Paris et al. . |
| 4,985,293 | 1/1991 | Keep . |
| 4,998,500 | 3/1991 | Zimmer . |
| 5,024,372 | 6/1991 | Altman et al. . |
| 5,034,091 | 7/1991 | Trask et al. . |
| 5,044,306 | 9/1991 | Erdmann . |
| 5,048,179 | 9/1991 | Shindo et al. . |
| 5,180,523 | 1/1993 | Durand et al. . |
| 5,183,593 | 2/1993 | Durand et al. . |

FOREIGN PATENT DOCUMENTS

| | | |
|---|---|---|
| 0195611 | 9/1986 | European Pat. Off. . |
| 0250006 | 12/1987 | European Pat. Off. . |
| 0542149 | 5/1993 | European Pat. Off. . |
| 2231614 | 1/1974 | Germany . |
| 1457805 | 12/1976 | United Kingdom . |

OTHER PUBLICATIONS

DuPont, Advances Solder Mask Technology for Complete, Economical Encapsulation of High–Density Surface Mount Technology PWB's, The Valu* System, Brochure.
DuPont, Valu SMT Solder Mask, Jun. 1993, Brochure.
Majestech Corp., One Pot Sol–C, Data Sheet.
Intercontinental Chemical Corporation, Material Safety Data Sheet, Oct. 8, 1992.
Subsurface Circuitry on Polymeric Substrates, IBM Technical Disclosure Bulletin, Oct. 1984, vol. 27, No. 5, pp. 2937–2938.
Abstract–Japan, vol. 14, No. 413 (E–0974) Sep. 1990 re JP–A–02158191.

*Primary Examiner*—Carl J. Arbes
*Attorney, Agent, or Firm*—Cushman Darby & Cushman

[57] ABSTRACT

A method of making a planar, subsurface electronic circuit having at least one electronic circuit component assembled therewith is disclosed. First, three dimensional, essentially square channels interspersed with lands are formed within a dielectric material on a substrate. The channels are then filled in one pass with a curable polymeric material containing a conductive metal filler so that the upper surfaces of the circuit trace formed by this conductive material are at essentially the same level as the upper surface of the lands. Circuit components are place to engage the conductive material. The curable material is then cured after placing the electronic component(s).

11 Claims, 7 Drawing Sheets

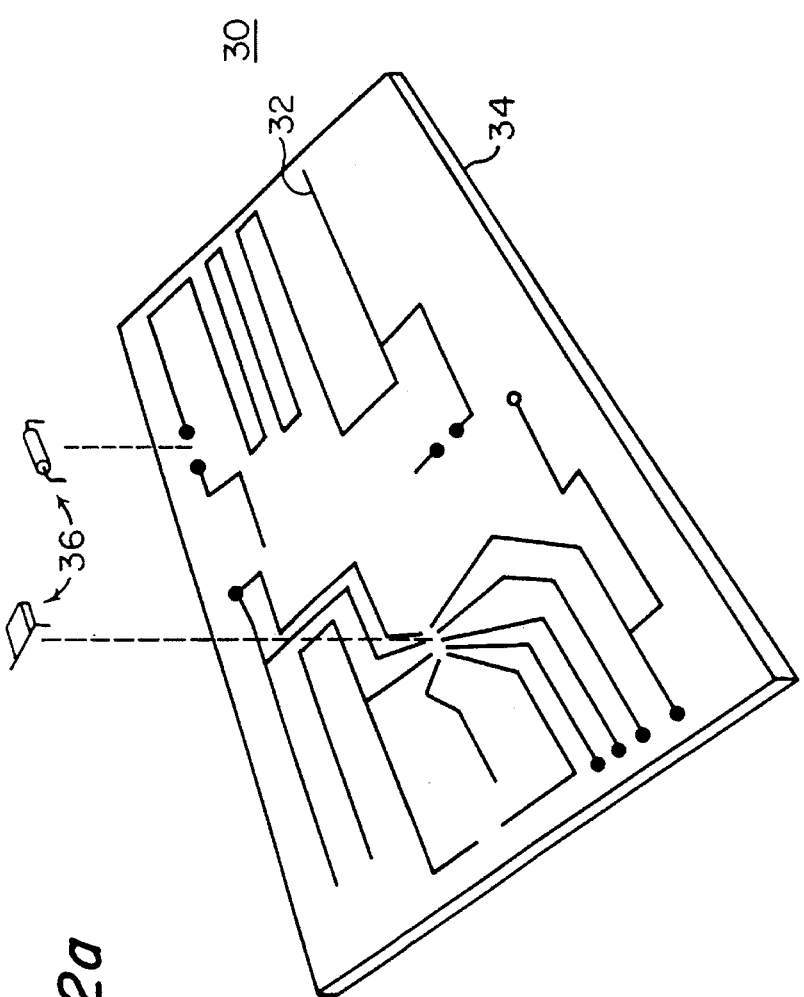
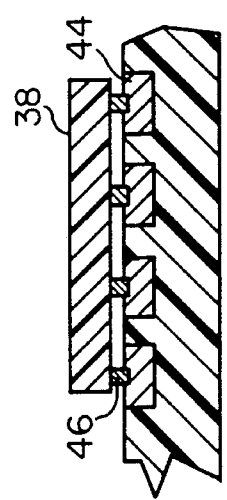
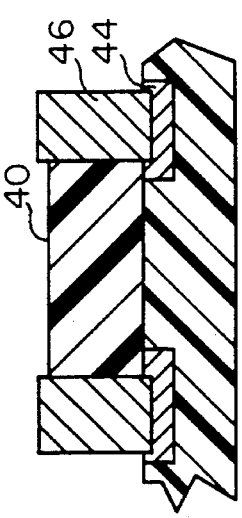
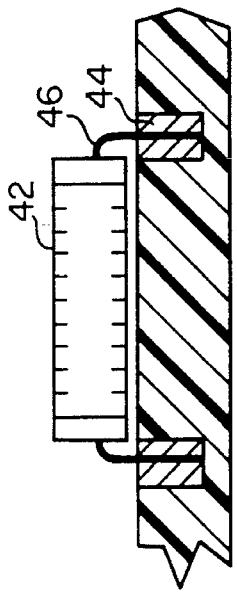
FIG. 2a
FIG. 2b
FIG. 2c
FIG. 2d

METHOD OF MAKING SUBSURFACE ELECTRONIC CIRCUITS

RELATED APPLICATIONS

This application is a continuation-in-part (CIP) of U.S. application Ser. No. 07/974,370, filed Nov. 10, 1992, which is a CIP of U.S. application Ser. No. 07/934,826, filed Aug. 24, 1992, abandoned, which is a continuation of U.S. application Ser. No. 07/607,554 filed Nov. 1, 1990 (now abandoned), which is a CIP of U.S. application Ser. No. 07/533,628 filed Jun. 5, 1990, now abandoned, which is a CIP of U.S. application Ser. No. 07/436,199 filed Nov. 14 1989 (now issued as U.S. Pat. No. 5,183,593).

FIELD OF THE INVENTION

This invention relates to an improved method of making electronic circuits. More particularly, this invention relates to an improved method of making planar, subsurface electronic circuits by filling channels in dielectric material with electrically conductive polymeric materials.

BACKGROUND OF THE INVENTION

Most electronic circuits on rigid substrates are still made by well known methods of etching copper-clad boards. A rigid dielectric substrate is first covered with copper or other electrically conductive material. Then, after temporarily protecting that portion of the conductive layer that will form the desired circuit trace, a substantial amount of this layer is chemically etched away. The protection is then removed, leaving copper traces in desired locations. One or more circuit components are attached to the circuit traces, usually by melting eutectic tin-lead solder.

Highly toxic materials used in these conventional methods have been, and continue to be, of great concern to individuals and the environment. Large amounts of water used in such methods have been discharged from manufacturing sites bearing trace amounts of metallic residues (lead, tin and copper, for example) as well as cyanides and other harmful wastes. Millions of rejected, worn out or obsolete electronic products containing such substances have been disposed in landfills where they are, or some day may be, pollutants of runoff or ground water. Additionally, millions of tons of ozone-destroying chlorofluorocarbons ("CFCs"), used to clean solder residues, have been released into the atmosphere from this source alone.

Planar subsurface electronic circuits made by filling channels in rigid dielectric substrates with electrically conductive materials, though not new per se, are not extensively used. For example, IBM Technical Disclosure Bulletin Vol. 27, No. 5, October, 1984, "Subsurface Circuitry On Polymeric Substrates", by E. W. Mace, discloses a method of forming subsurface circuits in an injection-moulded substrate having angled-wall channels. A compliant elastomeric blade or squeegee was used to fill the channels with a polymeric thick film conductive paste. The paste was drawn across the surface of the substrate using the squeegee to fill molded-in circuit lands. The substrate was then turned 90° and the filling process was repeated. The paste was dried and cured to its final state, following which excess cured paste was buffed away. Only then were circuit components attached to the cured conductive-paste-filed channels by various methods, including soldering.

This method has several characteristics. First, it takes two passes to fill the dielectric with the conductive paste. Second, unnecessary waste is produced because the substrate's surface must be sanded or buffed after the channels have been filled and cured to remove excess paste. Yet a third characteristic is that circuit components are placed onto the filled channels after the paste is cured. Thus, an additional step of electrically connecting the components to the paste is needed. Typically, this is achieved by soldering, which contains lead and is harmful to the environment.

U.S. Pat. No. 4,645,733 to Sullivan teaches a process which involves steps of: 1) covering a printed wiring substrate with a layer of photopolymer paste, 2) photographically producing a wiring pattern in the photopolymer, paste layer, 3) washing out uncured photopolymer to leave indentations in the cured photopolymer 4) using a squeegee to fill the indentations with a conductive material, such as a polymer ink, and 5) hardening the conductive material. However, residual conductive material remains on the surface, and must be removed by sanding.

SUMMARY

This invention provides an improved method of making planar, subsurface electronic circuits in rigid dielectric substrates. The method involves:

(a) forming three dimensional channels, interspersed with lands, within the dielectric material;

(b) depositing a curable material containing a conductive filler into the channels without remnants on the interspersed lands;

(c) placing at least one circuit component in engagement with the curable material in the channels; and (d) curing the curable polymeric material after placing at least one circuit component in engagement with the curable material, thereby making an electronic circuit.

It is, therefore, an object of this invention to provide an improved method of making electronic circuits.

It is also an object of this invention to provide an improved method of making planar, subsurface electronic circuits by filling channels in rigid dielectric substrates with electrically conductive materials.

Other objects, as well as the nature, scope and utilization of the present invention, will become readily apparent to those skilled in the art from the following description, drawings and appended claims.

BRIEF DESCRIPTION OF THE DRAWINGS

The invention will be described below with reference to attached drawings in which:

FIGS. 2a–2d illustrate details of a circuit made in accordance with the method of the present invention;

DETAILED DESCRIPTION OF THE PREFERRED EMBODIMENTS

The scope of the invention is defined by claims appearing at the conclusion of the description of the preferred embodiments. However, the organization, operation, advantages and objects of the invention can be more fully appreciated from the following description.

Figure 1D:
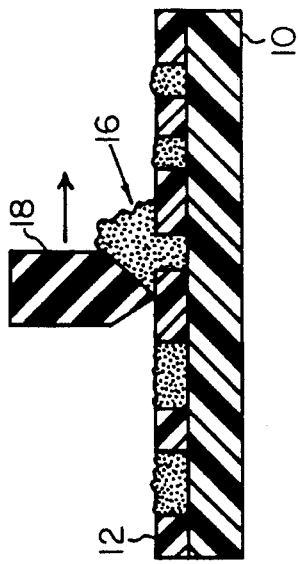
FIG. 1 illustrates general steps in a method according to the present invention.
Figure 1E:
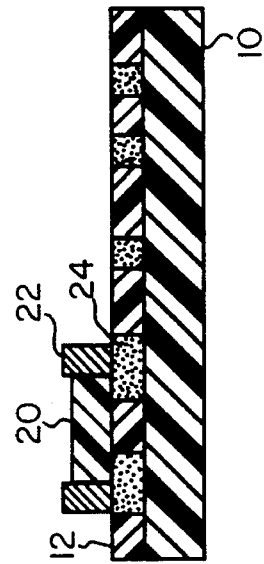
Figure 1F:
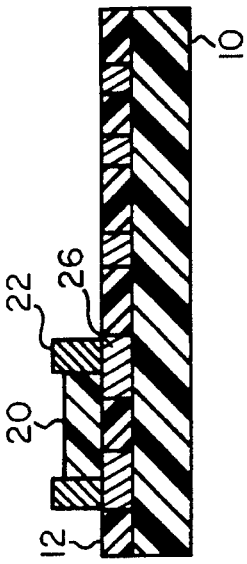
Figure 1A:
Figure 1B:
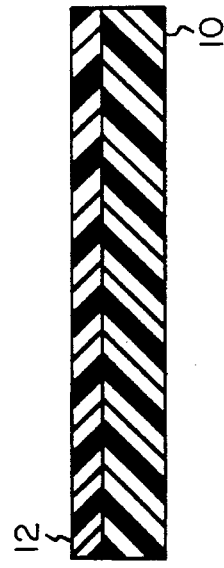

FIG. 1a–g illustrate the general steps in a method according to the present invention. The process begins with a rigid board base 10 as shown in FIG. 1a. Many different materials may be used depending on the ultimate application of the circuit. Selection factors include flammability rating and the expected environment in which the circuit will operate (e.g., whether in the engine compartment of a motor vehicle, in a consumer's home, etc.). The invention is versatile and can address a wide variety of needs. There are few known limits to the types of material which could potentially be useful. Key characteristics of the substrate are that it should be relatively flat, must withstand 130° C. processing temperatures and must be able to adhere a photo-imagable resist material.

The substrate can be flexible, and it is expected that flexible circuits made in accordance with the invention will be capable of flexing around an 8" mandril without cracking traces. Suitable flexible substrate materials are liquid crystal polymers, polyetherimides and polyester. Unless applications demand otherwise, rigid 0.059" thick glass fiber reinforced epoxy (known as FR-4) made by Polyclad Laminates, Franklin, NH is suitable.

Next, a photopolymer resist material 12 is applied to the substrate as shown in FIG. b. There are two general classes material: 1) liquid emulsion (which are cast directly onto substrate with an autocoating machine), then exposed and cured; and 2) precast film which adhere to the substrate. A wide variety of these materials are generally available from the DuPont Company for use as solder-masks. Most appropriate ones will retain integrity when etched to have lines that are 0.3 to 0.65 mil wide and separated by spacing approximately equal to their width. Materials offering less resolution (e.g., 12.5 mil, 20 mil, 30 mil and higher) will be useful for less demanding applications. As will become apparent from description of the process below, a material is said to retain integrity as long as channel walls do not collapse during other process steps, and thus will not to cause short circuits between adjacent channels.

Specialty techniques can also be used to apply the mask material, such as screen equipment which applies and simultaneously cures thin layers (20–30 micron) of liquid material. Key considerations are the resolution requirements of the final circuit, availability of material and cost. Unless applications demand otherwise, commercially available, dry-film solder mask material made from a photosensitive acrylate with good dielectric properties and capable of resolving 2 mil lines and spacing is suitable.

Figure 1C:
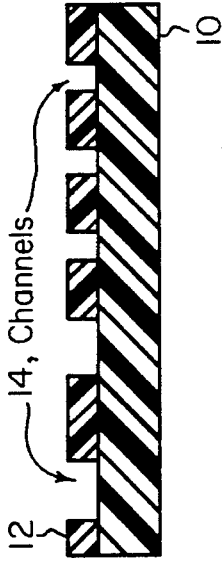

Next, the photoresist material is developed (e.g. exposed and cured) using procedures applicable to the selected material. For a dry-film solder mask material, an art-work film bearing an image of a desired circuit pattern is laid over the photoresist and exposed to ultraviolet (UV) light. The UV light causes the photoresist to harden. Photoresist material shielded from the UV light by patterns imaged onto the art-work film (the desired circuit pattern) remains relatively soft. The shielded material removed by a high pressure wash using procedures suggested by the manufacture of the photoresist. What remains are channels 14 in the hardened photopolymer as shown in FIG. 1c.

A conductive material 16 is applied to fill the channels in a manner that avoids remnants of conductive materials outside the channels. This deposition step is shown generically in FIG. 1d). One deposition method uses a doctor blade 18 to press material through a wire mesh screen (not shown in FIG. 1d but shown in greater detail FIG. 4) that has been coated with a blocking material. The screen allows the conductive material to be deposited in a pattern that matches the channel pattern. This aspect will be discussed in more detail below. An alternate method will be discussed with reference to FIG. 7. A number of suitable conductive materials are disclosed in U.S. Pat. Nos. 5,180,523 and 5,183,593, in copending U.S. application Ser. Nos. 07/934,826 and 07/974,370, and materials sold by Poly-Flex Circuits, Inc. of Cranston, Rhode Island under the tradename Poly-Solder. In general, these materials are combinations of silver flake particles and silver powder in a shrinkable, epoxy carrier that is capable of forming a moisture-resistant electrical contact between adhered surfaces.

The substrate is populated with circuit components 20 before the conductive material is permanently set, as illustrated in FIG. 1e. Electronic contacts 22 of the circuit components 20 are placed in contact with the uncured conductive adhesive 24. Then, the conductive adhesive 24 is cured, which sets the conductive material in the channels 26 and makes physical and electrical connection to the leads 22 of the circuit components 20 as shown in FIG. 1f. The method is quite suitable to automatic component placement by machine. Curing temperatures of conductive adhesives will typically be less than 180° C., more often less than 160° C., and preferably less than 140° C. well below the temperatures usually used for melting traditional lead-tin solder.

In an optional step (not shown), the components are covered with a protective layer. In cases where the substrate is flexible, mechanical strain may develop at the juncture between the electrical contact 22 and the conductive material 24 in the channel. The protective layer may be an adhesive that distributes strain away from the contact/channel juncture.

It will be appreciated that this method provides significant reduction in manufacturing cost by combining steps for curing the circuit and attaching the components. It will also be appreciated that this method reduces toxic by-products common to etching copper-clad substrates and traditional flux/solder processes. It will also be appreciated that, when using a flexible substrate, flexible polymer dielectric material, and flexible adhesive cement, the resulting circuit will be flexible.

FIGS. 2a–2d illustrate generally a circuit assembly made in accordance with the method of the present invention. FIG. 2a shows a generalized circuit 30 having conductive traces 32 formed in the manner described above. Electronic components 36 of varying packaging designs may be applied. FIGS. 2b, 2c and 2d illustrate details of connections for varying types of packages including flip chips 38, surface mount devices (SMD) 40 and traditional feed-thru devices 42. In each case, electrically conductive adhesive 44 in the channels binds to electrical connection points 46 on the respective packages, forming physical and electrical connections.

Figure 3A:
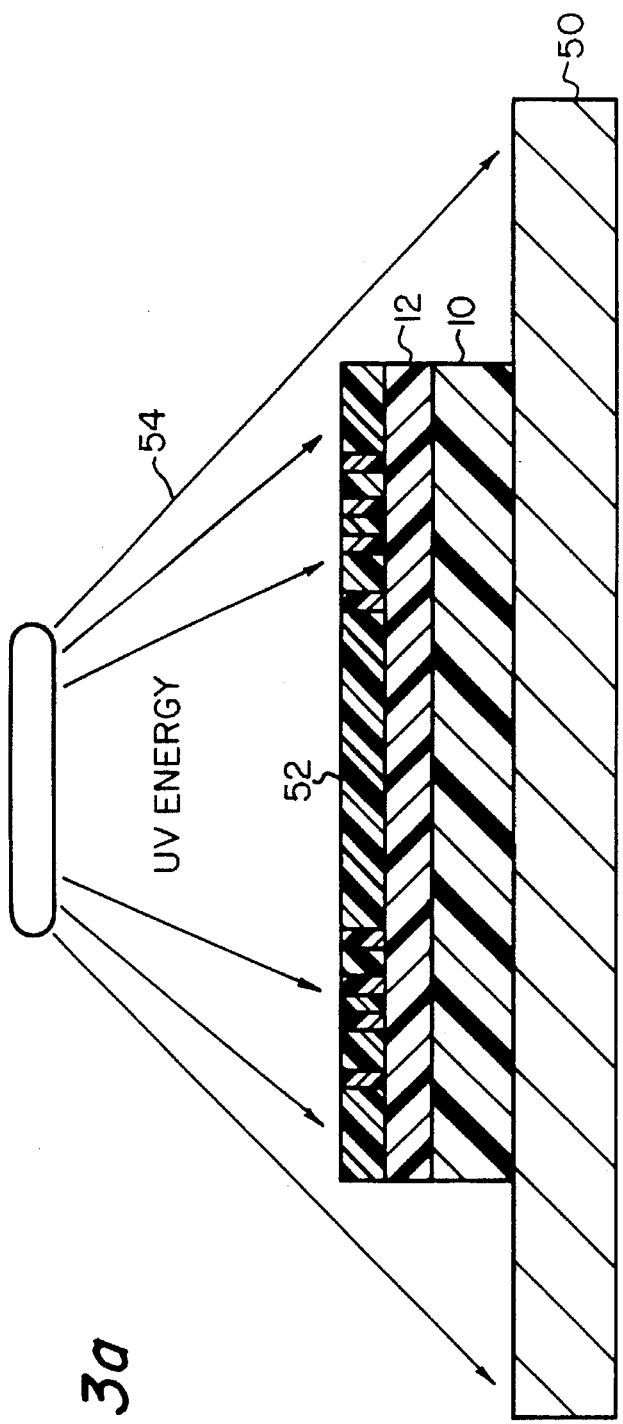
FIGS. 3a and 3b illustrate details of steps for forming channels.

FIGS. 3a–3d illustrate details of steps for forming channels using a photo-imagable material. In FIG. 3a, a vacuum table 50 holds a three-layer assembly in a fixed position. The three layer assembly includes a substrate 10 to which is attached a dry film photopolymer sheet 12 covered by a photo-tool 52 bearing an image of a circuit pattern to be formed.

Figure 6:
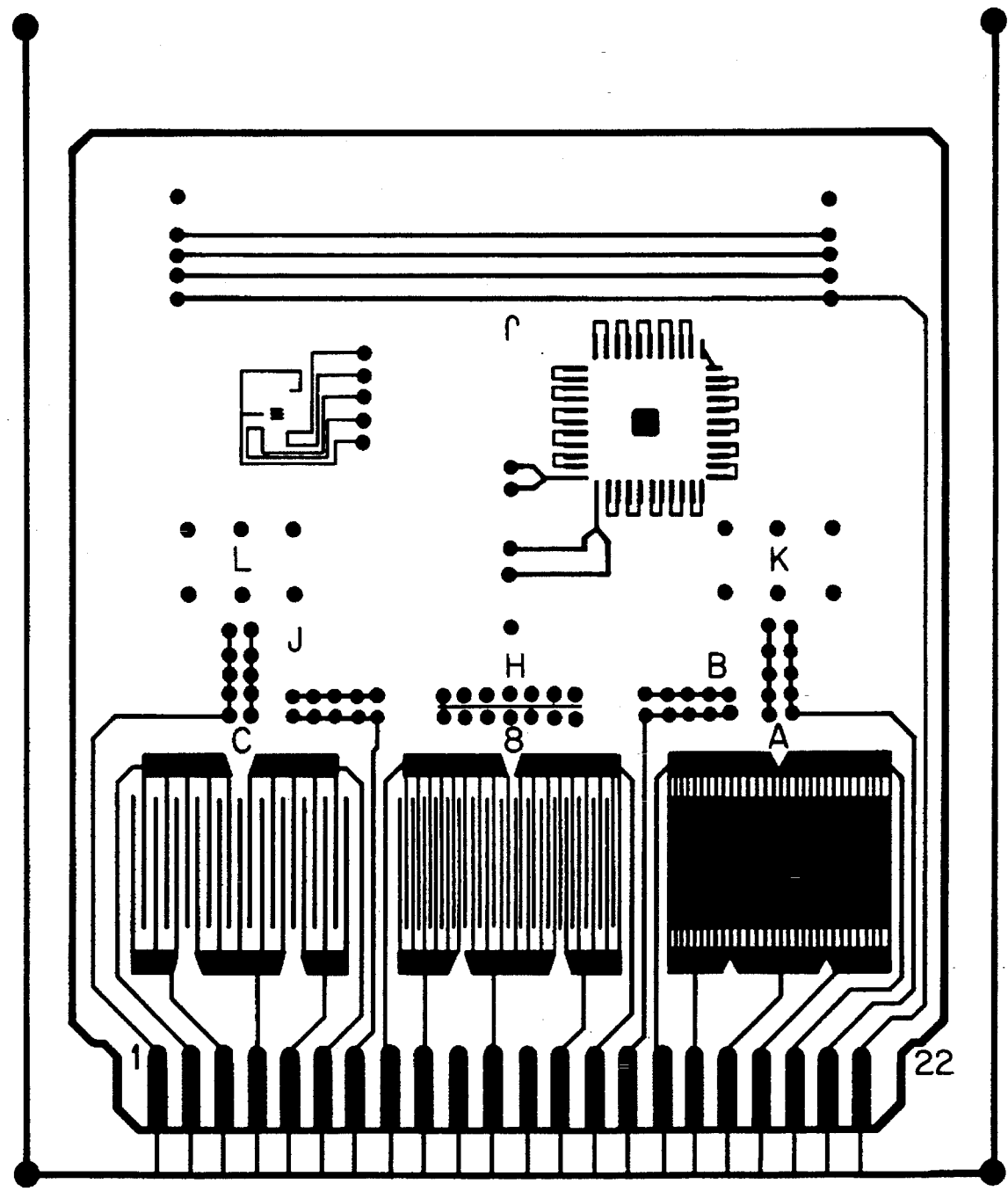
FIG. 6 illustrates a test circuit layout used to test differing materials and parameters in accordance with the present invention.

The photo-tool is made using circuit art-work production methods, usually CAD-based (computer aided design) that are well known in the electronics industry. An example circuit is shown in FIG. 6.

The photopolymer sheet is attached to the substrate using one of many well known techniques developed in other contexts of solder masks. The photopolymer is exposed to ultra violet energy 54, with dark traces imaged on the photo-tool serving to block the ultra violet energy in areas where channels will be formed.

Figure 3B:
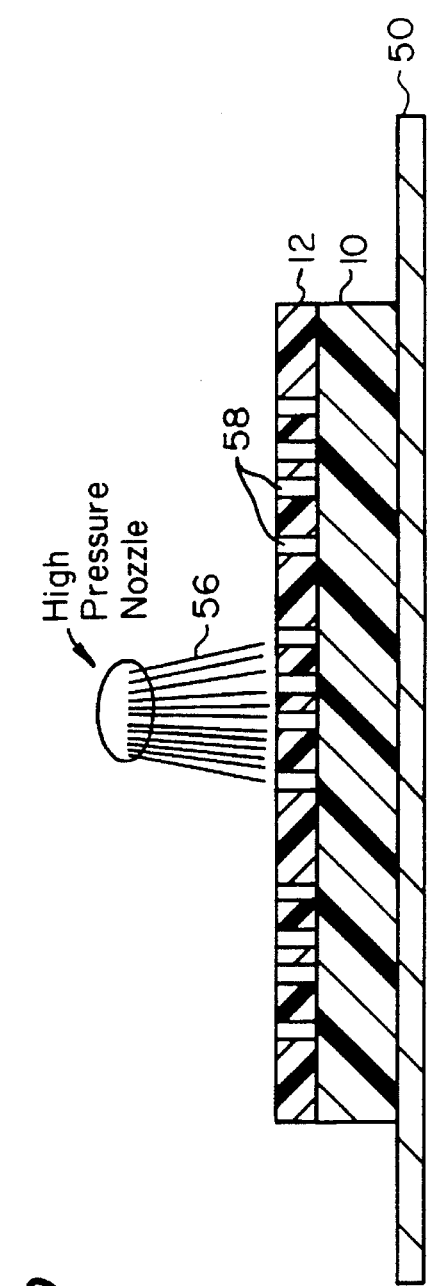

The photo-tool is removed and the pattern is developed, also using techniques developed for solder masks. In FIG. 3b, the photo-tool 52 has been removed to expose the photopolymer to a high pressure chemical wash. The wash removes unexposed, soft photopolymer and leaves channels 58 in a pattern that corresponds to the circuit pattern imaged on the photo-tool. Details of exposure and washing will depend on the photo-imagable material selected and proceeds in accordance with the manufacturer's instructions.

Figure 4:
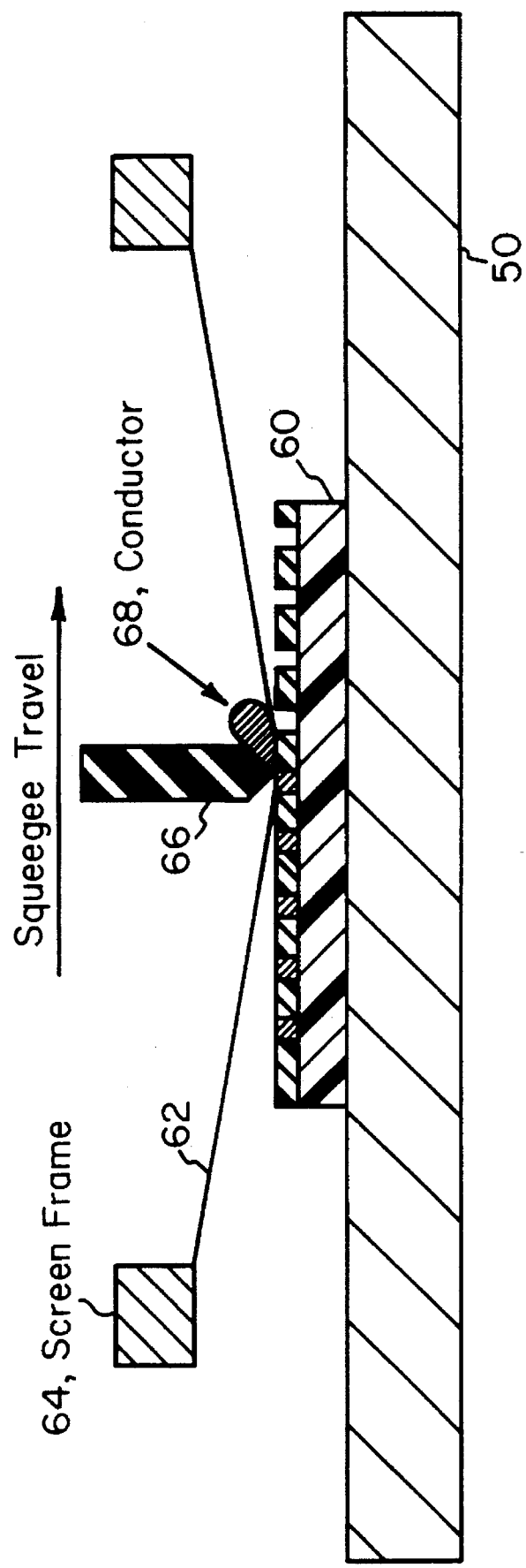
FIG. 4 illustrates details of steps for filling channels.

FIG. 4 illustrates details of steps for a first method of filling channels in a manner that avoids remnants of conductive materials outside the channels. The channel-bearing substrate 60 is held by the vacuum table 50 and positioned in a screening apparatus. The screen 62 is a wire mesh with wire diameter of 0.0007" to 0.0009" held in a frame 64. Larger wire sizes can be used as desired channel resolution becomes larger. The 0.0007" and 0.0009" sizes are appropriate for channel widths of 6.5 mil (0.0065"). The screen 62 bears an image that matches the channels formed on the substrate. That is, the screen has been coated with a blocking material except in a patten matching the channel pattern. Methods for making screens are known in the art, and any established practice capable of producing images with desired line resolution are suitable.

A squeegee 66 spreads conductive cement 68 across the screen 64, driving cement through the screen into the channel. As discussed above, the screen has been coated with a blocking material and then imaged to leave openings that allow conductive cement to pass through in a pattern that corresponds to the channels. Thus, the action of the squeegee and the screen allow the channels to be fully filled without deposited cement between the channels.

The illustration of FIG. 4 depicts the screen as held slightly above the level of the channels. In this technique, pressure applied by the squeegee presses the screen down to the channel level. As the squeegee passes, tension in the screen lifts the screen back off the channel level, leaving no significant amounts of material outside the channels. This method of screening is known in other contexts for printing, and it is within the skill of the art to adjust screen tension and the distance between the screen level and the channel level for the particular screen press used.

Circuit traces in a typical circuit layout tend to run along orthogonal directions, e.g., top-to-bottom or left-to-right. Similarly, screens have wire which run in orthogonal directions. It is helpful to rotate the screen at an angle relative to the directions of the circuit to improve the application of the pattern. The screen will typically be rotated 0°–45° more often 15°–30°, and preferably 20°–25° (e.g., 22.5 degrees).

Care must also be taken to align the screen with the substrate so that the image on the screen aligns with the channels. When line width is as low as 3–6 MIL, registration should be accurate to within ±0.001". One method for aligning the screen to the channels uses registration marks on the photo-tool (used for creating the channels), registration marks on the screen, and an optical method for aligning the marks. For example, substrates with channels are prepared using a pattern with a registration mark. A wire screen bearing a pattern identical to the channel and with an identically placed registration mark is loaded into a printing press and conductive cement is printed onto a blank substrate. A video camera mounted to the screen press images the location of the printed registration marks. In such a precision sensor press, the video system has a cross-hair or other adjustable indicator showing the location of the registration mark in the image. Then, the blank substrate is removed and replaced with a substrate having channels and bearing registration marks identical to the ones printed on the blank. The position of channelized substrate is adjusted until image of the registration marks in the channelized substrate are aligned with the cross-hair or other indicator showing the location of the registration mark of the blank. In an automatic method, the vacuum table may be moved under electronic control until the images of the registration marks align. After the channelized substrate is aligned, the press is operated again to print through the screen and into the channels.

Figure 5C:
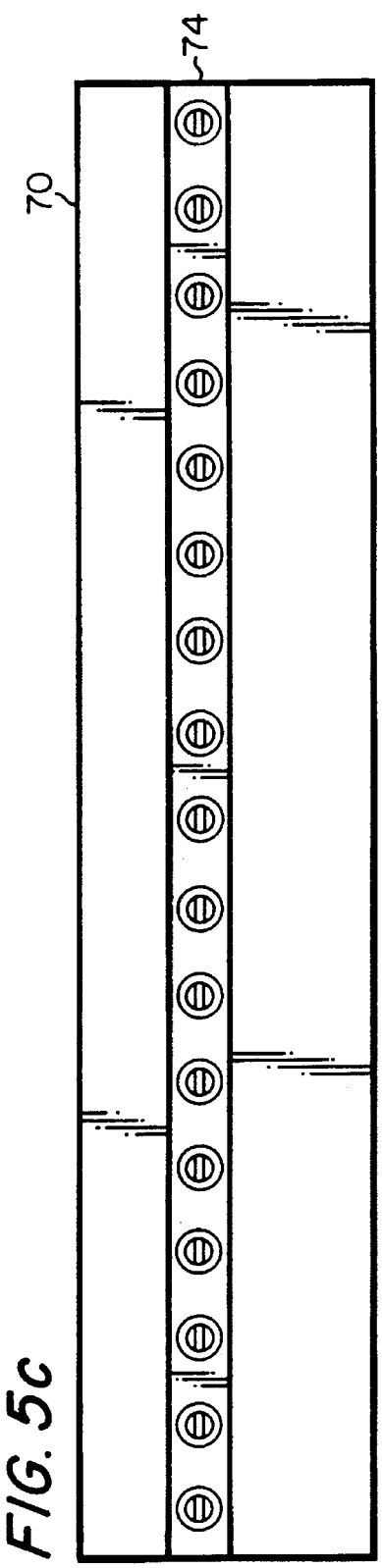
FIGS. 5a–5c illustrate details of a doctor blade used to spread conductive material into channels.
Figure 5B:
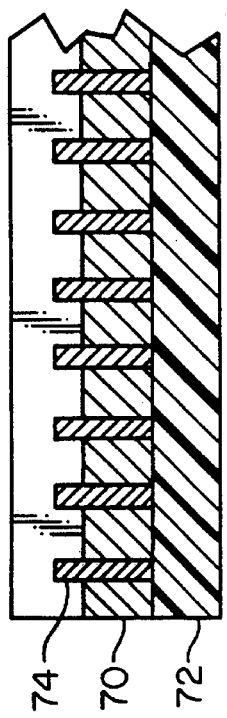
Figure 5A:
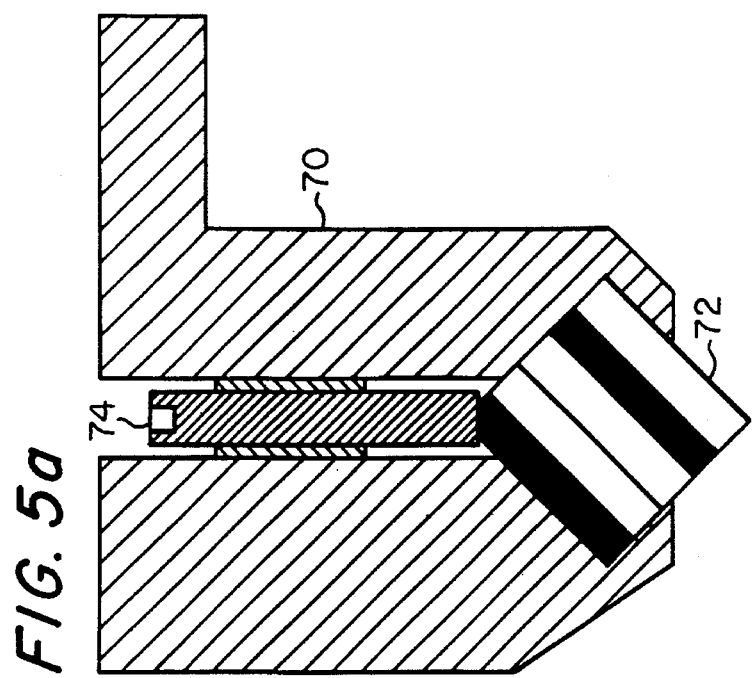

FIGS. 5a–5c illustrate details of a squeegee used to spread conductive material across a screen and into channels. FIG. 5a is an end view showing the squeegee frame 70, a diamond-shaped polyurethane blade 72 and alignment screws, while FIGS. 5b and 5c are side and top views respectively. The alignment screws 74 allow height adjustment for leveling along the length of the blade 72. A simple squeegee design is preferred in order to simplify cleaning and avoid contamination (residue carried from one run to the next).

EXAMPLES I–IV

Four exemplary circuits are described which were formed using the screening procedure discussed above. All used a circuit design as shown in FIG. 6. Different regions were designed to test different aspects of the process. Each example used a 24" by 24" wire screen and 8" squeegee. All used FR-4 substrate with photopolymer film. The photo-tool was supplied to a commercial PC board manufacturer, Precision Coating Services, Massachusetts, who returned a channelized substrate using standard solder-mask techniques.

Four channelized substrates were then screen printed, each using different conductive materials. The screens were aligned manually using the video imaging method described above. Channels were formed to a channel depth of about 1.9 MIL (the thickness of the photopolymer film). Fill level indicates the depth of the fill material. Depths are measured from the top of the channels, so that a positive value indicates that fill material rose above the channel, while a negative value indicates that material did not reach the top of the channel.

The circuits were measured for electrical characteristics and then sectioned to measure fill depth and trace height. The results are presented in Tables I–IV below. Electrical resistivity was measured for 30 MIL line widths. The results are shown in Table V.

TABLE I

| Ink: | DuPont 5007 | | | |
|---|---|---|---|---|
| Viscosity: | 13.6k cps (1.0 rpm) | | | |
| Substrate: | FR-4 | | | |
| Squeegee: | 70 Durometer | | | |
| Cure: | 120° C. 5 min | | | |
| Line Widths: | 30 MIL | 25 MIL | 12.5 MIL | 6.5 MIL |
| * Channel Depth (Ave): | −1.89 | −1.89 | −1.89 | −1.89 |
| * Fill Level (Ave:) | −0.84 | −0.43 | −0.57 | −0.45 |
| Trace Height: | 1.05 | 1.46 | 1.32 | 1.44 |

TABLE II

| Ink: | Olin Hunt Silver PTF (28RF107) | | | |
|---|---|---|---|---|
| Viscosity: | 11.4k cps (1.0 rpm) | | | |
| Substrate: | FR-4 | | | |
| Squeegee: | 70 Durometer | | | |
| Cure: | 200° C. 1 hour | | | |
| Line Widths: | 30 MIL | 25 MIL | 12.5 MIL | 6.5 MIL |
| * Channel Depth (Ave): | −1.89 | −1.83 | −1.96 | −1.83 |
| * Fill Level (Ave:) | −0.02 | −0.40 | −0.11 | 0.00 |
| Trace Height: | 1.87 | 2.23 | 1.85 | 1.83 |

*Measured from the surface plane of the FR-4.

TABLE III

| Ink: | 60 phr POLY-SOLDER ® | | | |
|---|---|---|---|---|
| Viscosity: | 31.5k cps (1.0 rpm) | | | |
| Substrate: | FR-4 | | | |
| Squeegee: | 70 Durometer | | | |
| Cure: | 140° C. 15 min | | | |
| Line Widths: | 30 MIL | 25 MIL | 12.5 MIL | 6.5 MIL |
| * Channel Depth (Ave): | −1.86 | −1.83 | −1.82 | −1.75 |
| * Fill Level (Ave:) | 0.64 | 1.10 | 0.70 | 0.53 |
| Trace Height: | 2.50 | 2.93 | 2.52 | 2.28 |

TABLE IV

| Ink: | POLY-SOLDER ® | | | |
|---|---|---|---|---|
| Viscosity: | 162k cps (1.0 rpm) | | | |
| Substrate: | FR-4 | | | |
| Squeegee: | 70 Durometer | | | |
| Cure: | 140° C. 15 min | | | |
| Line Widths: | 30 MIL | 25 MIL | 12.5 MIL | 6.5 MIL |
| * Channel Depth (Ave): | −1.89 | −1.89 | −1.89 | −1.89 |
| * Fill Level (Ave:) | 0.75 | 1.37 | 1.35 | 1.01 |
| Trace Height: | 2.64 | 3.26 | 3.24 | 2.90 |

*Measured from the surface plane of the FR-4.

TABLE V

| Trade Width: | 0.030 | | |
|---|---|---|---|
| Trace Length: | 3.000 inches | | |
| Conductive Material | Resistance | mΩ/sq | mΩ/sq/mil |
| DuPont 5007 | 2.93Ω/2.98Ω | 29.3 | 31.8 |
| Olin Hunt 28RF107 | 1.5Ω/1.5Ω | 15.0 | 28.1 |
| POLY-SOLDER (31.5k cps) | 5.30Ω/5.48Ω | 53.9 | 134.8 |
| POLY-SOLDER (162k cps | 5.62Ω/5.57Ω | 56.0 | 147.8 |

As can be seen, conductive inks of Tables I and II, which have higher contents of conductive particles than the conductive cement of Tables III and IV, have lower resistivity. On the other hand, Conductive cements, which having more adhesive, have higher resistivity. It is contemplated that the choice of material will depend on the ultimate circuit application. Those applications having greater demands on physical adhesion may prefer to use conductive cement, while circuits having greater demands on low resistivity may prefer to use conductive ink.

EXAMPLE V

A fifth example is described in which channels were filled using the screening method described above, but with variations in the dielectric material and the conductive composition used to fill the channels. The dielectric (mask material) used to make the channels was DuPont VALU (TM) solder mask (8400 Series/t-1197 Liquid) applied, imaged and developed in accordance with the manufacturer's method. The channel pattern was a set of parallel, interdigitated channels, each channel 5 mils thick, each channel separated by 5 mils of solder mask. Channel depth was about 1.3 mil.

The conductive material used to fill the channels was mixture of 325 parts DuPont 5007 with 300 parts Acheson Colloids Co. SS-24747 (a graphite in Resin Solution not specifically formulated for conductivity). Although channels were initially fully filled, fill level after curing was about −0.87 mil (roughly ⅓ of the channel remained filled). Channels exhibited resistivity of about 70 ohms/inch. The dielectric not breakdown when subjected to 2,000 bolts between adjacent channels.

As a variation on the procedures described above, it is contemplated that hybrid methods may be used in which substantial lengths of the channels are filled with conductive ink using a first screen and then remaining areas (e.g., bonding areas for electrical components) are filled with conductive cement using a second screen. Electrical components can then be placed, and both conductive materials cured together. Alternately, the ink may be cured before applying the cement. Even so, electrical components may be placed before curing the cement.

EXAMPLE VI

A sixth example is described in which conductive material is deposited without a screen, which is illustrated in FIG. 7. A substrate 100 illustrated in FIG. 7a) is similar to substrates used in Examples I–V. Two layers of mask material are applied to the substrate as illustrated in FIG. 7b). The first layer 102 is a liquid photo-imagable solder mask material, Enthone Enplate (TM) DSR 3241. It is drawn across the substrate and dried. The second layer 104 is a different photopolymer emulsion, such as Murakami One Pot Sol-C. A variety of emulsions may be used as long as the second (top) emulsion may be removed without also removing the first (lower) emulsion.

Figure 7A:
FIG. 7a–7g illustrates general steps in a screenless method according to the present invention.
Figure 7B:
Figure 7C:
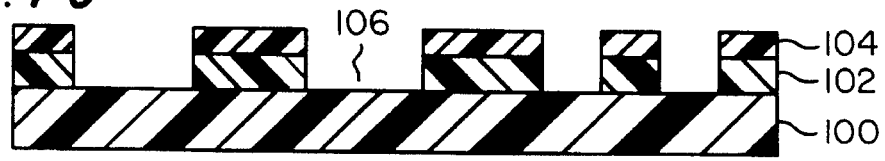

The two emulsion layers are photo-imaged and developed in much the same manner as with a single emulsion in order to form channels 106 as illustrated in FIG. 7c. The emulsions may be exposed using UV light, and the uncured material washed away to leave channels 106. If necessary, two separate wash steps may be used, one to wash uncured material from each of the two layers 102, 104.

Figure 7D:
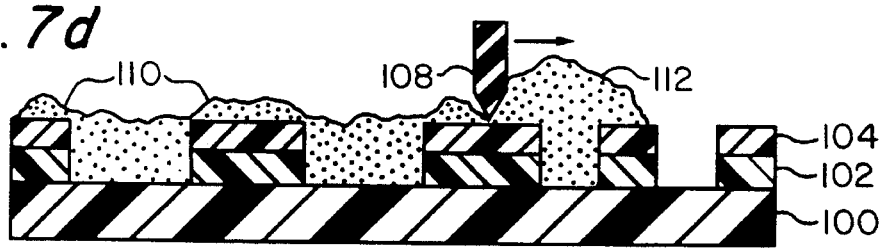

A curable conductive material 112 (such as one of the Poly-Solder (TM) compositions used in Examples III or IV) is then applied directly (without screening) to the two-layer assembly as illustrated in FIG. 7d). The curable conductive material may be drawn by hand across the assembly using an elastomeric squeegee 108, or by using a screening press without a screen. It can be expected that some uncured conductive material 110 will remain outside the channels.

Figure 7E:
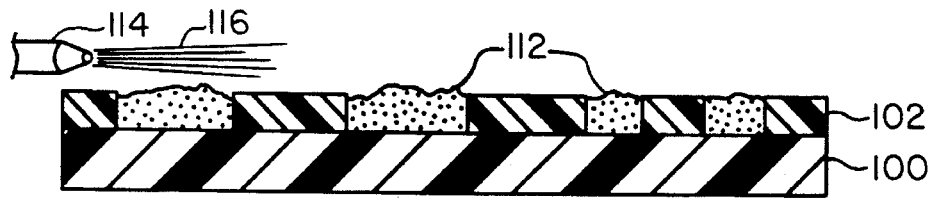

The assembly is then washed using a pressure nozzle 114 dispensing a solvent 116 that reclaims the cured second (top) layer as illustrated in FIG. 7e). For a second (top) layer made of One Pot Sol-C, a suitable reclaiming solvent is ICC 833 stencil remover made by Intercontinental Chemical Corporation.

As the second layer 104 dissolves and washes away with the reclaiming solvent, it carries away any residual conductive material 110 that was deposited outside the channels. By selecting a reclaiming solvent 116 that does not also dissolve the curable conductive material 112, the reclaiming step selectively removes residual conductive material 110 which was mixed with the soluble second layer 104.

Figure 7F:
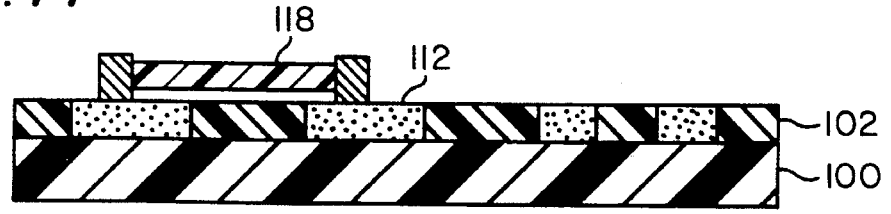
Figure 7G:
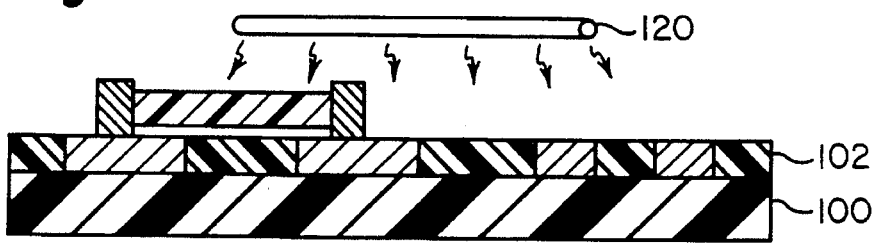

Electrical components are then applied to the curable conductive material 112 as shown in FIG. 7f. After placing components, the curable conductive material 112 is cured using ultra violet light 120 as illustrated in FIG. 7g).

As will be appreciated by those skilled in the art after reading this disclosure, many applications do not require stringent tolerances, and the method of the present invention takes advantages of numerous manufacturing advantages. For example, tooling is minimized, in part because the process of forming channels is simple relative to injection molding and mechanical removal processes. The ability to apply conductive material without remanent between channels eliminates a need for buffing and allows components to be placed before curing the conductive polymer. In this way separate steps for curing the channels and affixing components can be achieved in a single operation without soldering.

A further advantage of the present invention is the elimination of soldering heat. Many electronic components are susceptible to damage from the relatively high temperatures needed to melt allow solder. Although the present process uses heat to cure the conductive polymer, the temperatures are much lower-as low as 130° C. for polymer cure, compared to over 180° C. for lead-tin solder.

Although the examples show a single layer circuit, it will become evident after reading and understanding the process described above that multi-layer circuits can also be formed using these techniques. The process proceeds as described above until the step of placing components. Rather than placing components, polymer in the channels is cured. Then a new layer of photo-polymer is applied and new channels formed. After curing and cleaning the second photopolymer layer, channels in the second layer are filled with conductive material. Regions of overlap between this second layer and the (already cured) first layer act as connections (vias), because the bottom of a channel of the second layer is exposed to the top of a channel of the first layer. After applying conductive polymer to the second layer, components are placed and the second layer is cured. By extension, third and higher layers can be applied.

After learning of the embodiments described above, people practicing in this art will be able to make variations that fall within the spirit and scope of the invention. The embodiments described above are exemplary but not intended to limit unduly the scope of the invention as defined by the following claims.

What is claimed is:

1. A method of making electronic circuits in a rigid dielectric substrate comprising steps of:
   (a) forming a channel within a dielectric substrate;
   (b) screening a curable conductive material into the channel to form an uncured circuit trace;
   (c) placing circuit components in engagement with the uncured circuit trace; and
   (d) curing the curable conductive material after placing the circuit components, thereby creating a circuit trace which electrically connects the circuit components;
   wherein the channel forming step includes steps of:
   i) applying a layer of photoimagable material on to the substrate,
   ii) exposing the photoimagable material with an image corresponding to the circuit trace, and
   iii) developing the photoimagable material, thereby leaving a channel in the layer of photoimagable material.

2. A method of making electronic circuits in a rigid dielectric substrate comprising steps of:
   (a) forming a channel within a dielectric substrate;
   (b) screening a curable conductive material into the channel to form an uncured circuit trace;
   (c) placing circuit components in engagement with the uncured circuit trace; and (d) curing the curable conductive material after placing the circuit components, thereby creating a circuit trace which electrically connects the circuit components;

wherein the channel forming step includes steps of:

i) forming a first portion of the circuit trace in a first layer of the substrate;

ii) forming a channel in a second layer of the substrate, the channel overlapping a region of the first portion of the circuit trace.

3. A method of making electronic circuits in a rigid dielectric substrate comprising steps of:

(a) forming a channel within a dielectric substrate;

(b) filling the channel with a curable conductive material to form an uncured circuit trace;

(c) placing circuit components in engagement with the uncured circuit trace; and (d) curing the curable conductive material after placing the circuit components, thereby creating a circuit trace which electrically connects the circuit components;

wherein the channel forming step includes a step of forming a removable layer on the substrate around the periphery of the channel, and the channel filling step comprises steps of:

i) spreading the curable conductive material across the removable layer and into the channel, and ii) removing the removable layer while leaving curable conductive material in the channel.

4. A method of making electronic circuits in a rigid dielectric substrate comprising steps of:

(a) forming a channel within a dielectric substrate;

(b) screening a curable conductive material into the channel to form an uncured circuit trace;

(c) placing circuit components in engagement with the uncured circuit trace; and (d) curing the curable conductive material after placing the circuit components, thereby creating a circuit trace which electrically connects the circuit components;

wherein the channel forming step includes a step of forming a removable layer on the substrate around the periphery of the channel, and the channel filling step comprises steps of:

i) spreading the curable conductive material across the removable layer and into the channel, and ii) washing away the removable layer with a solvent while leaving curable conductive material in the channel.

5. The method of claim 4 wherein the washing step includes a step of spraying solvent onto the substrate with a nozzle.

6. A method of making electronic circuits in rigid dielectric substrates comprising steps of:

(a) applying a layer of photoimagable material on to a substrate, (b) exposing the photoimagable material with an image corresponding to a circuit trace, (c) developing the photoimagable material, thereby leaving a channel in the layer of photoimagable material;

(d) screening curable conductive material into the channel through a screen having a pattern matching the channel to form an uncured circuit trace;

(e) placing circuit components in engagement with the uncured circuit trace; and (f) curing the curable conductive material after placing the circuit components, thereby creating a cured circuit trace which electrically connects the circuit components.

7. The method of claim 4, wherein steps (a) to (f) are performed after first forming a first conductive trace in the substrate, and steps (a) to (f) form a second conductive trace above and in electrical contact with the first conductive trace, thereby forming a multi-layer circuit.

8. The method of claim 6 wherein the curing step includes a step of curing at a temperature below about 180 degrees C.

9. The method of claim 6 wherein the curing step includes a step of curing at a temperature between about 130 degrees C. and about 180 degrees C.

10. The method of claim 6 wherein the component placement step includes a step of placing a surface mount device.

11. The method of claim 6 wherein the component placement step includes a step of placing a flip chip.

* * * * *